US009009631B2

(12) United States Patent
Looije et al.

(10) Patent No.: US 9,009,631 B2
(45) Date of Patent: Apr. 14, 2015

(54) LITHOGRAPHY SYSTEM AND METHOD FOR STORING POSITIONAL DATA OF A TARGET

(75) Inventors: Alexius Otto Looije, Naaldwijk (NL); Michel Pieter Dansberg, Berkel en Rodenrijs (NL); Marcel Nicolaas Jacobus Van Kervinck, The Hague (NL); Guido De Boer, Leerdam (NL)

(73) Assignee: Mapper Lighography IP B.V., Delft (NL)

( * ) Notice: Subject to any disclaimer, the term of this patent is extended or adjusted under 35 U.S.C. 154(b) by 527 days.

(21) Appl. No.: 13/545,896

(22) Filed: Jul. 10, 2012

(65) Prior Publication Data

US 2013/0016327 A1    Jan. 17, 2013

Related U.S. Application Data

(60) Provisional application No. 61/506,581, filed on Jul. 11, 2011.

(51) Int. Cl.
*G06F 17/50* (2006.01)
*G03F 7/20* (2006.01)

(52) U.S. Cl.
CPC ........ *G03F 7/70725* (2013.01); *G03F 7/70775* (2013.01)

(58) Field of Classification Search
CPC ......................... G03F 7/70775; G03F 7/70725
USPC ............................................. 716/51; 355/53
See application file for complete search history.

(56) References Cited

U.S. PATENT DOCUMENTS

| | | | |
|---|---|---|---|
| 6,603,529 B1 * | 8/2003 | Finarov | 355/27 |
| 2004/0021840 A1 * | 2/2004 | Heintze | 355/30 |

(Continued)

FOREIGN PATENT DOCUMENTS

| | | |
|---|---|---|
| EP | 2096494 A | 9/2009 |
| JP | H0744221 A | 2/1995 |
| JP | 2006078262 A | 3/2006 |

OTHER PUBLICATIONS

International Preliminary Report on Patentability from International Application No. PCT/NL2012/050494 dated Jan. 14, 2014 (1 page).

(Continued)

*Primary Examiner* — Suchin Parihar
(74) *Attorney, Agent, or Firm* — Blakley Sokoloff Taylor & Zafman

(57) ABSTRACT

The invention relates to a lithography system for patterning a target, said system comprising a feedback control system comprising an actuator for displacing the target, a measurement system for measuring a position of said target, and a control unit adapted for controlling the actuator based on the position measured by the measurement system, said feedback control system having a first latency being a maximum latency between measuring and controlling the actuator based on said measuring, a storage system for storing the measured positions, comprising a receive buffer and a storage unit with a second latency being an average latency between receiving measured positions in the receive buffer and storing said measured positions in the storage unit, wherein the first latency is at least an order of magnitude smaller than the second latency, the feedback control system comprising a unidirectional connection for transmitting said measured positions to the storage system.

27 Claims, 4 Drawing Sheets

(56) References Cited

U.S. PATENT DOCUMENTS

| | | |
|---|---|---|
| 2004/0022291 A1* | 2/2004 | Das et al. ............... 372/55 |
| 2004/0125355 A1 | 7/2004 | Naya et al. |
| 2004/0128918 A1 | 7/2004 | Yang et al. |
| 2005/0110970 A1* | 5/2005 | Butler ................. 355/53 |
| 2006/0119829 A1* | 6/2006 | Cox et al. ............. 355/72 |
| 2007/0182944 A1* | 8/2007 | Van De Biggelaar ........ 355/53 |
| 2007/0239390 A1 | 10/2007 | Yun et al. |
| 2009/0231566 A1* | 9/2009 | Schneiders et al. ......... 355/67 |
| 2011/0029685 A1 | 2/2011 | Itai et al. |
| 2013/0335722 A1* | 12/2013 | Aangenent et al. ......... 355/72 |

OTHER PUBLICATIONS

Written Opinion of the International Searching Authority and International Search Report from International Application No. PCT/NL2012/050494 dated Dec. 14, 2012 (6 pages).

* cited by examiner

LITHOGRAPHY SYSTEM AND METHOD FOR STORING POSITIONAL DATA OF A TARGET

This is a non-provisional application claiming the benefit of U.S. Provisional Application No. 61/506,581, filed Jul. 11, 2011.

BACKGROUND

The invention relates to a lithography system for writing a pattern on a moveable target, such as a wafer, and a storage system for storing data comprising a measured position of the target within the system. The invention further relates to a method for storing such positional data.

United States patent application 2011/0029685 describes a method and system in which data recording the operation of an exposure apparatus is output via a communication path to an information processing apparatus comprising a storage unit for storing said data, and a communication unit for transmitting data requested by one or more terminals to said one or more terminals. This data recording the operation of the exposure apparatus may comprise information measured by a wafer stage measurement system for use by a wafer stage control system to control the position of a wafer, and may be stored for weeks or days to be requested at a later time through one of the terminals for further analysis.

In similar systems, the storage unit forms part of a feedback control loop, which feedback control loop comprises one or more sensors for sensing a position of a target in an exposure apparatus, wherein said sensed positions are stored in the storage unit, an actuator for moving said target within the exposure apparatus, and a control unit for controlling the actuator to move the target within the exposure apparatus based on the measured positions stored in said storage unit.

A drawback of these known systems is that the storage unit, in order for it to be able to keep up with the supply of data, must be able process data at least at the same rate as the wafer stage measurement system. This is prohibitively expensive when the amount of positional data to be recorded is very large, especially when the data is being stored in and read out from the storage system at substantially the same time.

It is an object of the present invention to provide a lithography system and method providing a more cost effective way for storing positional data of a target.

SUMMARY OF THE INVENTION

According to a first aspect, the present invention provides a lithography system for writing a pattern on a target using one or more exposure beams, said system comprising a feedback control system comprising an actuator for displacing the target within the lithography system, a measurement system for substantially continuously measuring a position of the target relative to the lithography system, and a control unit adapted for controlling the actuator based on the position measured by the measurement system, said feedback control system having a first latency defined as a maximum latency between said measuring and said controlling the actuator based on said measuring, a storage system for storing the measured positions, said storage system comprising a receive buffer and a storage unit, said storage system having a second latency defined as an average latency between receiving measured positions in the receive buffer and storing said measured positions in the storage unit, wherein the first latency is at least an order of magnitude smaller than the second latency, the feedback control system comprising a unidirectional connection for transmitting said measured positions to the storage system.

As the storage unit of the storage system may have a relatively high latency, a relatively cheap storage unit may be used. The storage unit may for instance comprise an array of hard disks or tape drives, instead of more expensive transistor based or solid state memory. Moreover, in case of delay or malfunction of the storage system the operation of the feedback control system is not affected as information travels only from the feedback control system to the storage system, but not the other way around.

In an embodiment the feedback control system is adapted for substantially continuous operation independent of the storage system. Thus, even when the storage system has no free capacity left, fails or is replaced, the lithography system may continue to be used for patterning targets. Even when storage of the measured positions and/or other data at any time is slower than the latency of the feedback control system, the feedback control system is thus not affected, and consequently, positioning of the target in the lithography remains unaffected.

In an embodiment no data or signals are sent from the storage system to the feedback control system. As the feedback control system thus operates completely independent of the storage system, any error or delays in storing data in the storage system do not influence the positioning of the target in the lithography system by the actuator and the control unit.

In an embodiment the storage system is external from said feedback control system. The storage system thus provides long-term storage of data from the feedback control system, without forming part of said feedback control system.

In an embodiment the unidirectional connection comprises a network connection, allowing easy connection with between the storage system and the positioning system, the measurement system of the lithography system and/or other modules of the lithography system such as network devices for communication within the feedback control system.

To facilitate physical coupling of the modules the connection preferably comprises an optical fiber Ethernet cable. Data may be transmitted at high speeds through such cables without generating electrical fields in the lithography system. Alternatively, unshielded twisted pair (DTP), shielded twisted pair (STP) or foiled twisted pair (FTP) cables may be used.

In an embodiment the system further comprises a network switch having multiple inputs and at least one output, wherein at least one of said inputs is connected via the unidirectional connection to the feedback control system, and wherein said output is connected to the receive buffer. The same storage system may thus be used for storing data from several inputs. Besides data from the feedback control system, comprising positional data measured by the measurement unit and/or control data generated by the control unit for controlling the actuator, data from other modules of the lithography system may be provided to other inputs of the switch for long term storage by the storage system. Preferably, each module of the lithography system is connected to the network switch using a separate unidirectional connection.

In an embodiment the unidirectional connection comprises a connection from the measurement system to the switch and/or a connection from the feedback control system to the switch. For instance, the feedback control system may provide two unidirectional connections to two different inputs of the switch, one such connection from the measurement unit to the switch for transmitting measured positions to the storage system, and another such connection from the control unit to the switch for transmitting control data generated by the control unit for controlling the actuator to the storage system. Alternatively, as the control unit receives the measured positions from the measurement unit, the unidirectional connection may comprise a single connection from the control unit to the storage system for transmitting both the measured position and control data generated by the control unit for controlling the actuator to the storage system.

In an embodiment the sum of maximum data rates of said multiple inputs is less than the maximum data rate of the at least one output. For instance, when the switch has two inputs each having a data rate of at most n bytes/second, then the output of the switch must have a data rate of at least 2*n bytes/second. Preferably the maximum data rate of the output is at least a factor 5 greater than the sum of data rates of the inputs to reduce the chance of congestion at the switch. As, in this embodiment, a combined data rate of the inputs is always less than an available data rate of the at least one output, all data input to the switch will also be output from the switch, and no data loss will occur within the switch.

In an embodiment the first latency is at most 200 microseconds, and the second latency is at least 2000 microseconds.

In an embodiment the positions measured by the measurement system comprises positions in at least two dimensions. The target may thus be accurately placed under the projection optics. When the surface of the target is substantially planar, these two separate directions are preferably parallel to said plane and preferably orthogonal to each other.

In an embodiment the system is adapted for using the User Datagram Protocol over the unidirectional connection. This protocol is especially suitable for transmitting data without acknowledging receipt thereof. As the feedback control system only transmits and does not receive data over the unidirectional connection, operation of the feedback control system is not affected by operation of the storage system.

In an embodiment the storage system is adapted for storing the measured positions during at least an entire duration of time needed for processing a target from start to finish. During processing from start to finish a target is typically processed by several separate modules besides the lithography according to the invention, such as modules for coating a target with resist, for exposing a target to exposure beams, for developing the exposed resist, for inspecting the target and/or for etching the target. To facilitate physical coupling of the modules the connection preferably comprises an unshielded twisted pair (UTP), shielded twisted pair (STP) or foiled twisted pair (FTP) or optical fiber Ethernet cables.

The duration of time for processing a target from start to finish is defined as the time between the start of processing the target in the lithography system, and the time after which the target is completely processed and no further processing of the target will occur. Thus, at any time during processing of a target, information on previous processing steps is available. The cause of defects in a target which only become apparent near finishing processing of the target may thus be determined retrospectively from the data for said target stored in the storage system. In practice the time between the start of processing a target and finishing the processing of the target may be at least two months, during which time the target may be repeatedly processed in the same lithography system, for instance for exposing different layers of the target.

In an embodiment the positions are measured at a sampling frequency of 5 kHz or more, with each sample preferably comprising at least 512 bytes of data.

In an embodiment reading data from the storage system does not influence operation of the feedback control system, even when data is being transmitted from the receive buffer of the storage system to the storage unit.

In an embodiment the receiving buffer adapted for discarding data from the feedback control system when the receiving buffer is full.

In an embodiment the receive buffer comprises a last-in-first-out or first-in-first out buffer, or a circular buffer in which data which has been present longest in the buffer is overwritten when new data is supplied. Preferably, when the receive buffer is full and new data is supplied to the buffer, the new data is stored in such a manner that the old data is interleaved with the new data. Thus, though some data may be lost before storing it in the storage system, the data that is stored will relate to data more evenly recorded over time. E.g. when the receive buffer is full and position measurements d1, d2, d3, d4 are in the buffer, then new measurements d5 and d6 will replace measurements d1 and d3 respectively.

In an embodiment the receive buffer comprises a solid state memory capable of receiving data comprising positional measurements from the feedback control system at at least the rate with which the data is transmitted from the feedback control system to the receive buffer.

In an embodiment the receiving buffer has a first storage capacity and the storage unit has a second storage capacity, wherein the second storage capacity is at least three orders of magnitude larger than the first storage capacity, preferably at least 5 orders of magnitude.

In an embodiment the feedback control system is further adapted for transmitting to the storage system via the unidirectional connection, one or more of control data, a timestamp, a sequence number, data representative of the internal state of the control unit, and control unit timing settings.

In an embodiment the storage system is adapted for receiving said data out of order. Based on information such as sequence number or timestamp the data may later be processed in sequential order.

In an embodiment the lithography system comprises an optical column for writing a pattern on a target using one or more exposure beams, wherein said optical column comprises a focusing array for focusing said one or more exposure beams onto the target.

In an embodiment said measurement system comprises an interferometer.

In an embodiment the lithography system is adapted for writing said pattern while said target is being moved within said lithography system. In such systems, the area of a target that is illuminated by exposure beams at any one time is substantially less than the total exposure surface area of the target. Thus, exposing the entire target surface takes a relatively long time, and accurate positioning of the target during exposure is especially important. The storage system must therefore be capable of storing very large amounts of data are generated in the feedback control system during exposure of a target.

In an embodiment said one or more exposure beams comprise a multitude of charged particle beamlets. Such beamlets are be used to write features on the pattern at nanometer scale, such that accurate positioning is especially important.

According to a second aspect the present invention provides a method for storing positional data of a target moveable within a lithography system, said method comprising the steps of:
substantially continuously measuring the position of the target within the lithography system,
substantially continuously controlling displacement of the target to correct for a deviation between the measured position and a desired position of the target, wherein a first latency is defined as a maximum latency between said measuring and said controlling the actuator based on said measuring, storing said measured position in a storage system, wherein a second latency is defined as an average latency between receiving measured positions in the receive buffer and storing said measured positions in the storage unit, wherein the first latency is at least an order of magnitude smaller than the second latency, the feedback control system comprising a unidirectional connection for transmitting said measured positions to the storage system.

Preferably the lithography system used in the method is a lithography system according to the present invention.

In an embodiment said controlling is performed independent of said storing.

In an embodiment said measured positions are stored for at least an entire duration of time needed for processing a target from start to finish.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
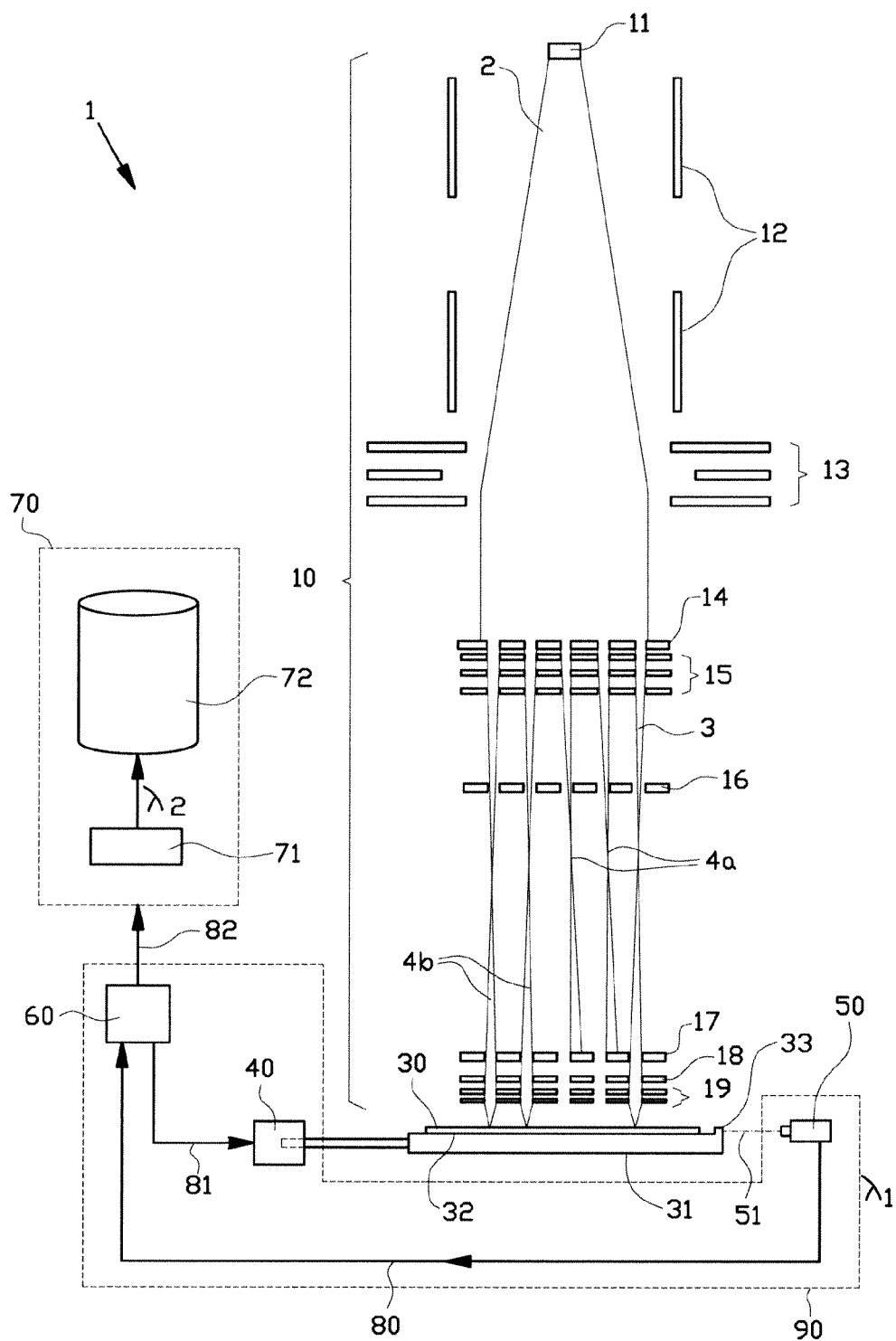
FIG. 1 shows a first embodiment of a lithography system according to the invention.

An embodiment of a lithography system according to the invention is shown in FIG. 1. The lithography system 1 comprises an optical column 10 comprising a charged particle beam source 11 which emits a charged particle beam 2. The charged particle beam 2 traverses a double octopole 12 and collimator lens 13 before impinging on an aperture array 14. The aperture array 14 splits the charged particle beam 2 into a multitude of charged particle beamlets 3 which are condensed by condenser array 15. At beam blanker array 16 some of these individual beamlets are blanked, i.e. beamlets 4a are be deflected such that they encounter beam stop array 17 later on in their trajectories instead of passing through apertures in beam stop array 17. The beamlets 4b that have not been blanked then pass through a deflector unit 18 which is adapted to provide a scanning deflection of said beamlets in the X- and Y-directions. At the end of their trajectories the beamlets 4b pass through a lens array 19 adapted for focusing said beamlets onto a surface of a target 30 supported by a target carrier 31. The target carrier 31 comprises a substantially flat surface 32 for supporting the target 30, and a raised edge 33 substantially at the same level as the target 30 and comprising a reflective material. An actuator 40 is adapted for displacing the target carrier 31 and target 30 thereon along the X and/or Y direction relative to the optical column 10 according to a control signal from control unit 60. During patterning of the target 30, the target carrier and target 30 are moved by the actuator 40 under the optical column 10, such that the unblanked beamlets 4b may be mechanically scanned to different positions on the target. A measurement system 50 substantially continuously measures the position of the target 30 in the lithography system 1, preferably relative to the optical column 10. In the embodiment shown the measurement system 50 comprises an interferometer 50 which emits a measurement beam 51 onto the reflective surface 33 of the target carrier 31 and measures a reflection thereof to determine the position of the target 30 in the lithography system 1. The measured position is transmitted via unidirectional connection 80 to the control unit 60, which updates the control signal send to the actuator based on a difference between a desired position of the target 30 in the lithography system 1, and the measured position. The updated control signal is send to the actuator 40 via unidirectional connection 81.

The actuator 40, the interferometer 50, and the control unit 60 together form a feedback control system 90 which substantially continuously measures and updates a position of the target 30 within the lithography system 1. The maximum latency $\lambda 1$ within the feedback control system 90 between measurement of the position by the measurement system 50 and sending the updated control signal to the actuator 40 in the embodiment shown is at most 200 ms, and the frequency with which positions are measured, or sampled, by the measurement system 50 is at least in the order of 5 to 10 kHz. Typically, each position measurement comprises at least 512 bytes of data, such that at least 2.56 MB of position data is generated each second.

Besides controlling the actuator 40, the control unit 60 also transmits the measured positions and/or the processed measured positions to a receive buffer 71 of storage system 70, via unidirectional connection 82. To ensure that the feedback control system 90 may continue operation uninterrupted, it is ensured that no data or signals are sent from the storage system 70 to the feedback control system 90 by providing only a unidirectional connection there between.

The receive buffer 71 has at least sufficient capacity for storing multiple measurements, for instance for storing all position measurement data obtained during a 20 ms period. In the embodiment shown the receive buffer 70 is capable of receiving data at the same rate or a higher rate than the rate with which the position data is measured by the measurement system 50. When the receive buffer 71 is full it no longer accepts data from the feedback control system 90 and any data transmitted from the feedback control system 90 to the receive buffer 50 is discarded.

The storage system further comprises a storage unit 72 of a sufficient capacity to store position data measured during at least an entire duration of time needed for processing a wafer or batch of wafers from start to finish using the lithography system. The required storage capacity C may be calculated as C=T*R, with T being the time in seconds needed for processing a wafer or batch of wafers from start to finish, and R being the amount of data generated each second by the measurement system. For example, when the time needed to process a wafer from start to finish is 60 days (i.e. 5,184,000 seconds), and the amount of measured position data generated each second is 2.56 MB, then the required capacity is 5,184,000 seconds*2.56 MB/s=13,271,040 MB=13.27104 TB. The average latency $\lambda 2$ of the storage system 70 between receiving the position data in the receive buffer 71 and storing said data in the storage unit 72 is at least an order of magnitude greater than the maximum latency $\lambda 1$ of the feedback control loop 90. The receive buffer 71 comprises a relatively small memory with low latency, and the storage unit 72 comprises relatively large but less costly memory with a higher average latency.

Figure 2:
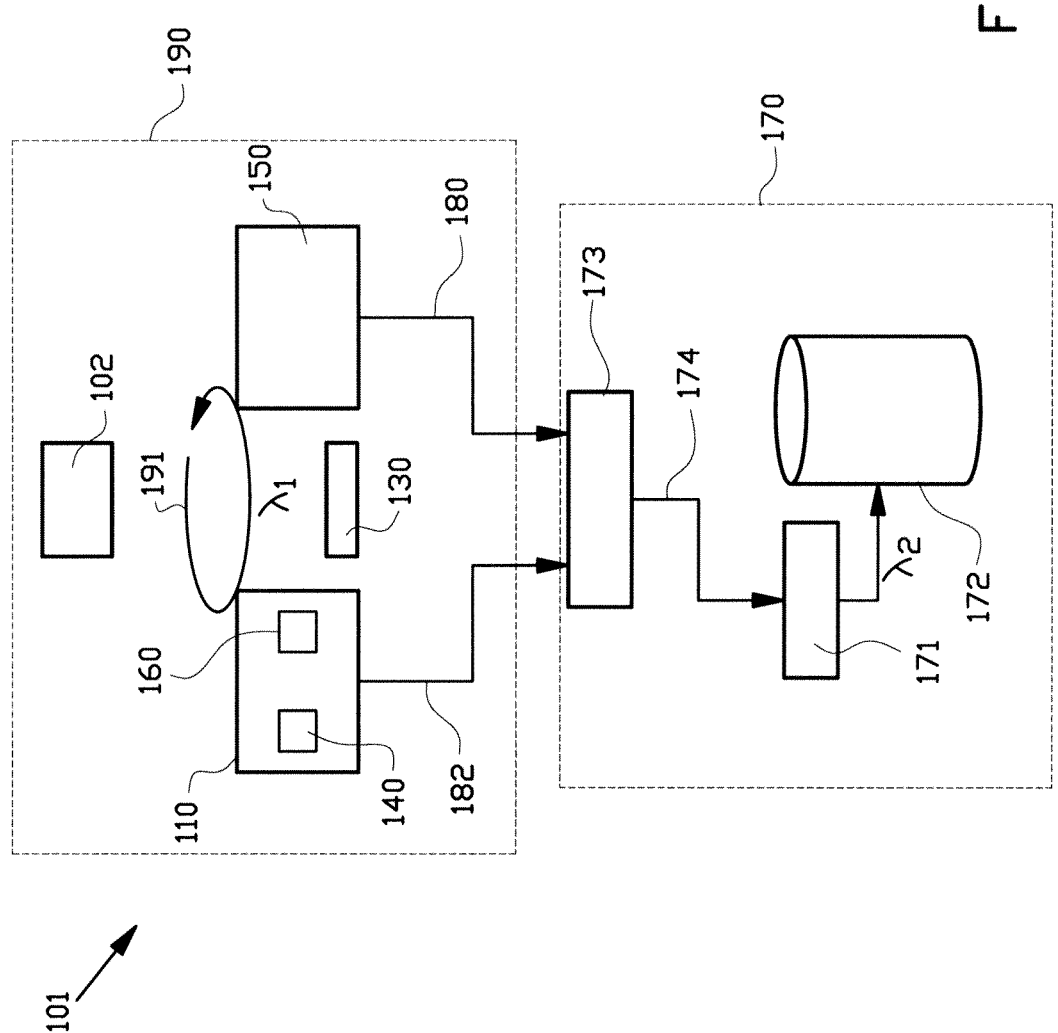
FIG. 2 shows a detail of a feedback control system and a storage system of a second embodiment of a lithography system according to the invention.

FIG. 2 schematically shows a detail of a storage system 170 and a feedback control system 190 for use in another embodiment of a lithography system 101 according to the invention. The lithography system 101 is adapted for patterning a target 130 using one or a plurality of fight beams projected from an optical column 102 onto a target 130, wherein said pattern may be formed using a reticle or mask, or by using a light beam modulator for modulating a plurality of light beams. The feedback control system 190 comprises a wafer positioning system 110 comprising an actuator 140 adapted for displacing a target, i.e. a wafer, within the lithography system, in particular parallel to a plane spanned by the target to be exposed by the lithography system. The feedback control system 190 further comprises a measurement system 150 adapted for substantially continuously measuring a position of the target within the lithography system. The wafer positioning system 110 also comprises a control unit 160 adapted for controlling the actuator 140 based on the measured position. Loop 191 indicates the exchange of information between the measurement system 150 and the wafer positioning system 110; target positions measured by the measurement system are coupled back to wafer positioning system 160 which in turn adapts the position of the target in the system based on the measurement. The feedback control system 190 operates under so called real-time constraints. This means that for the feedback control system to work the conditions must be met that the control unit 160 of the wafer positioning system receives 110 each position measurement from the measurement system 140 at predetermined fixed points in time, plus or minus a predetermined margin of error, and that that the control unit 160 provides the actuator 140 with control signals based thereon at predetermined fixed points in time, plus or minus a predetermined margin of error. If either of these conditions is not met, the positioning of the target is considered a failure. For instance, when a position measurement during exposure of a target is received by the control 160 system later than required, then the control system will not be able to control the actuator 140 in time to correct for any errors in target position and the target will be illuminated by an exposure beam at the wrong position. Whereas the feedback control system 190 must operate within strict real-time constraints, the storage system 170 may operate without such constraints, or at least under much less strict real-time constraints.

The measurement system 150 is connected via a first unidirectional connection 180 to a first input of switch 173 of the storage system 170. The wafer positioning system 110 is connected via a second unidirectional connection 182 to a second input of switch 173. Both unidirectional connections 180,182 are network connections comprising fiber optic Ethernet cables. Data is sent over these connections from the wafer positioning system 110 and the measurement system 150 to the switch 173 using the User Datagram Protocol (UDP), though other transmission protocols suitable for one-way communication may be used instead. The first and second inputs of the switch 173 which are connected to unidirectional connections 180,182 respectively, each have a maximum data rate of 100 Mb/s. The switch comprises an output connected to connection 174 from the switch to the receive buffer 171, having a maximum data rate of 1 Gb/s, such that throughput of the switch 173 is not limited by the data rate of its output. Positions are measured and corrected at a frequency of 5 KHz, and the latency $\lambda 1$ of the feedback control loop is less than 200 microseconds, whereas the average latency $\lambda 2$ between receiving data in the receive buffer 171 and storing the data in the storage unit 172 is 2100 microseconds.

Figure 3:
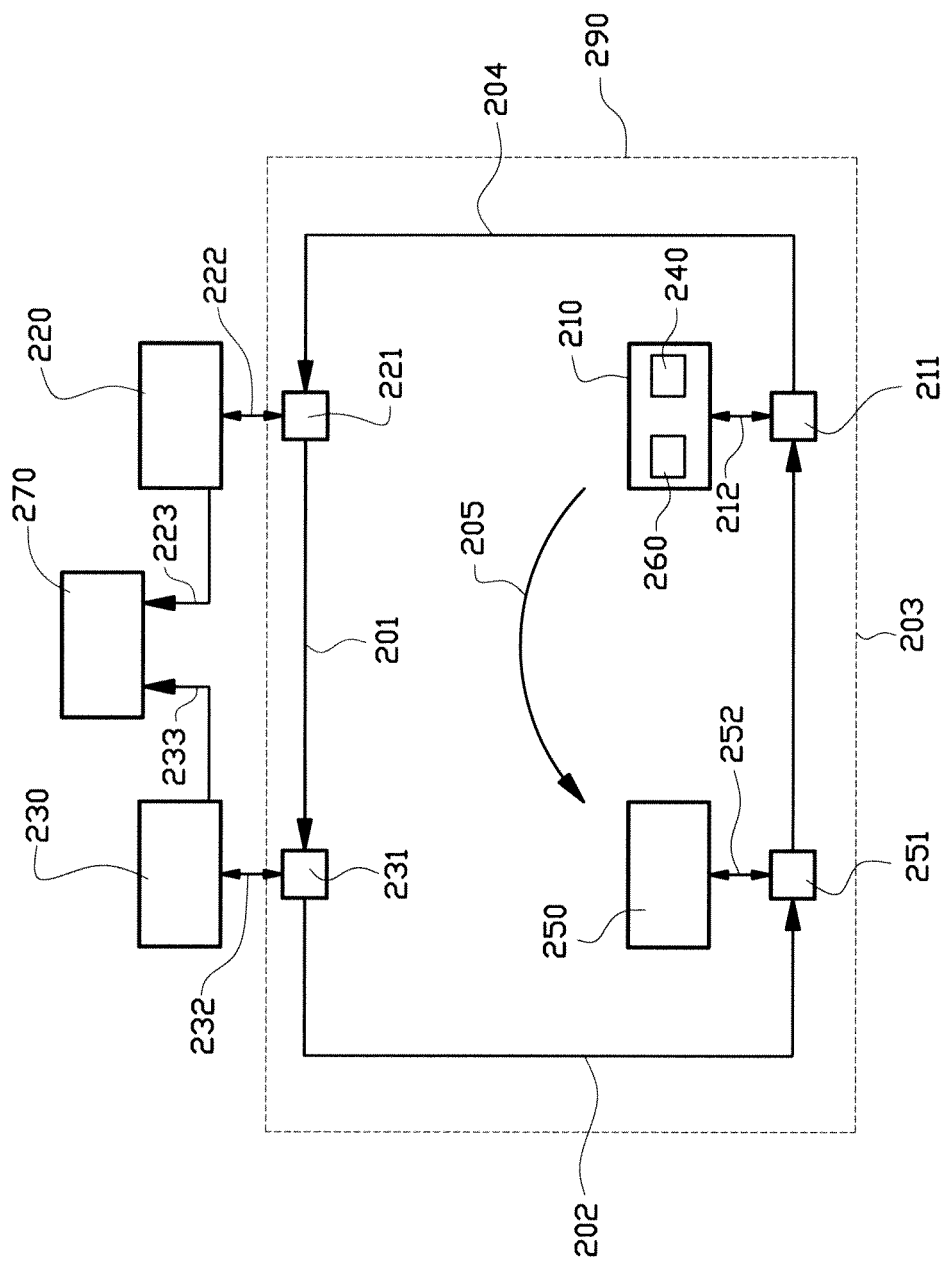
FIG. 3 shows a detail of a feedback control system and a storage system of a third embodiment of a lithography system according to the invention, FIG. 4 schematically shows different processing steps and modules for processing a target in a lithography system according to the invention.

FIG. 3 schematically shows a detail of another embodiment of lithography system according to the invention, comprising a storage system 270, a feedback control system 290, a measurement computer 230 and a wafer positioning computer 220. The feedback control system 290 comprises a measurement system 250, adapted for measuring a position of a wafer within the system, and a wafer positioning system 210, adapted for positioning the wafer in the lithography system. The feedback control system 290 further comprises a network formed by network devices 251, 211, 221 and 231, and unidirectional connections 201,202,203 and 204. Network devices 251,211,221,231 connect the measurement system 250, wafer positioning system 210, positioning control computer 220 and measurement control 230 computer respectively to the network via bidirectional connections 252, 212,222 and 232. Measurement computer 230 is adapted for sending basic control data to the measurement unit, for instance for initiating calibration thereof. The wafer positioning computer 220 provides data relating to desired positions for a target in time for wafer positioning system 210. Control unit 260 controls the actuator to correct for deviations between the desired position and the measured position at any time.

Connections 201,202,203,204 comprise optic fiber Ethernet cables. Data send from any of the network devices through the connections 201,202,203,204 goes around the network until it reaches the network device from which the data originated. Thus, position data measured by measurement system 250 is sent from the network device 251 to network devices 211, 221 and 231 respectively, such that all network devices in the network receive the same information. Arrow 205 indicates that information on a change in the actual position of the target caused by the controlling of the actuator is available to the measurement system 250 when the physical position of the target is measured. In other words, the measurement system 250 does not rely on the unidirectional network connections 201,202,203 or 204 to obtain a measurement of the position of the target in the lithography system.

Each network device 211,221,231,251 stores a local copy the data transmitted to it in a local memory before sending the data on to the next destination in the network. Any data transmitted over the unidirectional connections 201,202,203, 204 may thus be read from outside the feedback control loop 290 by reading this data from the local memories of network device 231 or network device 221, and reading data from any one of the network devices 221 or 231 does not change the latency in the feedback control system 290 between measuring a position and sending a control signal to the actuator 240 based on said measured position.

The storage system 270, which comprises a receive buffer and a storage unit as described herein, is connected via unidirectional connections 233 and 223 to measurement computer 230 and wafer control computer 220 respectively, such that any malfunctioning or delay in the operation of the storage system 270 does not affect the feed control system 290, the measurement computer 230 or the wafer positioning computer 220. The average latency between receiving data in the receive buffer of storage system 270 and storing data in the storage unit of the storage system 270 is three orders of magnitude larger than the latency of the feedback control system 290 between measuring a position of the target and sending a control signal to the actuator based on said measured position.

The feedback control system 290 operates under strict real time requirements, whereas at least the measurement computer 230 and storage system 270 thereof may operate under much less strict real time requirements.

Figure 4:
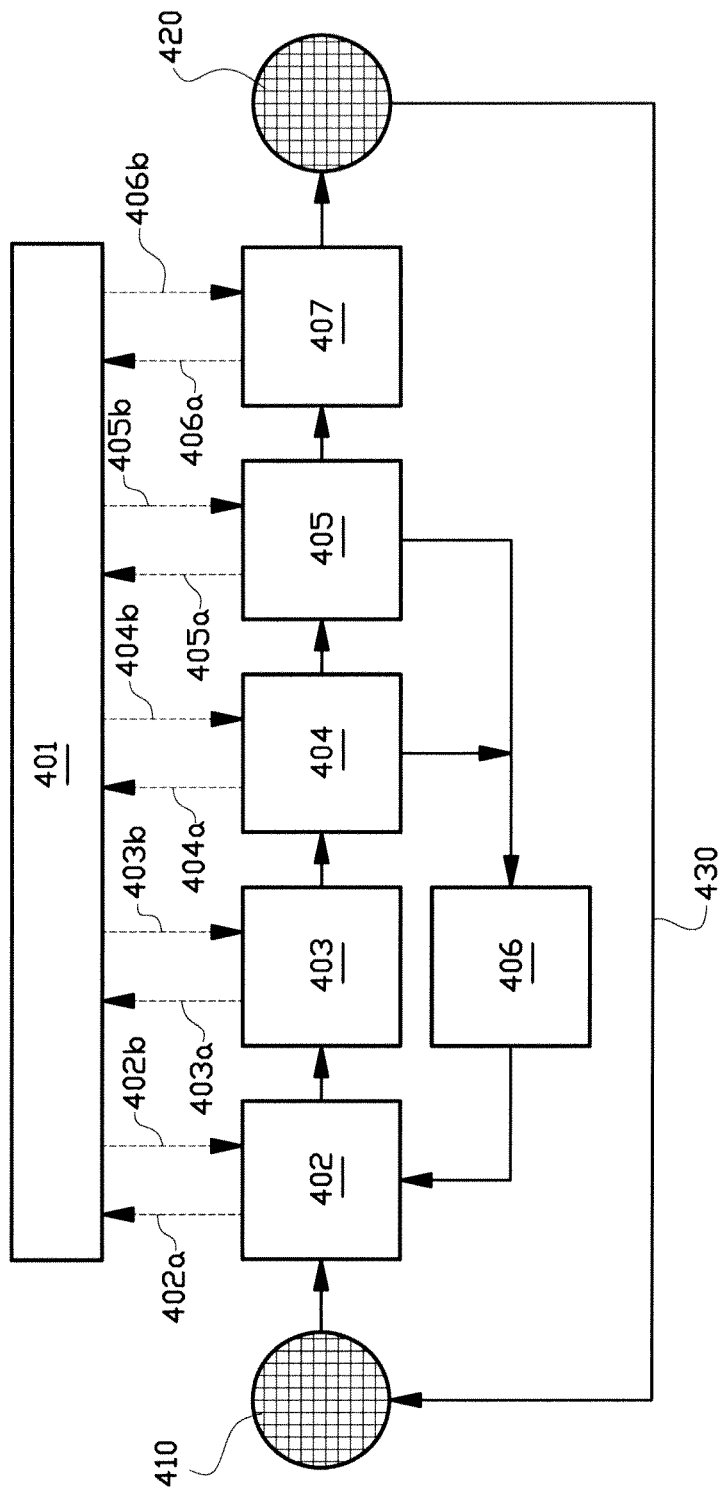

FIG. 4 schematically shows a processing line for processing a target, comprising a coating apparatus 402, a lithography system 403 according to the invention, a development apparatus 404, an inspection apparatus 405, and an etching apparatus 407, all of which may receive control data 402b, 403b,404b,405b,407b from master control unit 401, and may transmit feedback data 402a,403a,404a,405a,407a to the master control unit 401. The processing line further comprises a stripping apparatus 406 for stripping resist from targets that have been rejected during processing.

The process starts with a target, in this case a wafer 410. The target is inserted in coating apparatus 402 which applies a resist to an exposure surface of the wafer. Next, the coated wafer is inserted into lithography system 403, which is a lithography system according to the invention. The lithography system 403 comprises a feedback control system and a storage system as described above. As the feedback control system of the lithography system operates substantially independently from the storage system, stored feedback data may be read from the storage system and transmitted to the master control system without influencing the operation of the feedback control system.

Next, the wafer that has been exposed is transported to a development apparatus 404 where the resist is developed. In case positioning during exposure was not within a predetermined margin of error, the resist is not developed but the wafer is rejected and transported to a stripping apparatus 406. The stripping apparatus 406 is adapted for stripping resist from the wafer so that the same wafer may be coated again by coating apparatus 402 for reuse. In case errors were determined during developing of the wafer, the wafer is also transported to the stripping apparatus 406.

In case no substantial errors were detected during processing, the wafer is inspected at inspection apparatus 405. This apparatus uses a scanning electron microscope or the like to check whether dimensions of exposed features in the resist are within specifications. For example, line widths of features may be measured. If the inspected features in the resist are not within specifications then the wafer is rejected and transported to stripping apparatus 406 to strip the resist from the wafer and prepare the wafer for reuse.

If the exposed pattern is within specifications then the wafer is transported to etching apparatus 407 and etched and/or chemically mechanically polished.

Typically, an integrated circuit which is cut from a wafer comprises multiple layers and the wafer is led through coating apparatus 402, lithography system 405, developing apparatus 404, inspection apparatus 405 and etching apparatus 407 a corresponding number of times to construct those layers. Thus during processing of a target from start to finish, huge amounts of positional data become available, which must be stored at least while the target is being processing. In case an error occurs during any one of the processing steps of a target, the positional data may help in tracking the origin of the error. Moreover, the positional data may be used to improve the process.

In summary the present relates to a lithography system for patterning a target, said system comprising a feedback control system comprising an actuator for displacing the target, a measurement system for measuring a position of said target, and a control unit adapted for controlling the actuator based on the position measured by the measurement system, said feedback control system having a first latency being a maximum latency between measuring and controlling the actuator based on said measuring, a storage system for storing the measured positions, comprising a receive buffer and a storage unit with a second latency being an average latency between receiving measured positions in the receive buffer and storing said measured positions in the storage unit, wherein the first latency is at least an order of magnitude smaller than the second latency, the feedback control system comprising a unidirectional connection for transmitting said measured positions to the storage system.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Lithography system for writing a pattern on a target using one or more exposure beams, said system comprising:
   a feedback control system comprising an actuator for displacing the target within the lithography system, a measurement system for substantially continuously measuring a position of the target within the lithography system, and a control unit adapted for controlling the actuator based on the position measured by the measurement system, said feedback control system having a first latency defined as a maximum latency between said measuring and said controlling the actuator based on said measuring,
   a storage system for storing the measured positions, said storage system comprising a receive buffer and a storage unit, said storage system having a second latency defined as an average latency between receiving measured positions in the receive buffer and storing said measured positions in the storage unit,
   wherein the first latency is at least an order of magnitude smaller than the second latency,
   the feedback control system comprising a unidirectional connection for transmitting said measured positions to the storage system, and wherein the feedback control system is adapted for substantially continuous operation independent of said storage system.

2. Lithography system according to claim 1, wherein no data or signals are sent from the storage system to the feedback control system.

3. Lithography system according to claim 1 or claim 2, wherein said storage system is external from said feedback control system.

4. Lithography system according to any one of the preceding claims, wherein the unidirectional connection comprises a network connection, preferably comprising an unshielded twisted pair (UTP), shielded twisted pair (STP) or foiled twisted pair (FTP) cable, or an optical fiber Ethernet cable.

5. Lithography system according to claim 4, further comprising a network switch having multiple inputs and at least one output, at least one of said inputs connected via the unidirectional connection to the feedback control system, and said output connected to the receive buffer.

6. Lithography system according to claim 5, wherein said unidirectional connection comprises a connection from the measurement system to the switch and/or a connection from the feedback control system to the switch.

7. Lithography system according to claim 5 or claim 6, wherein the sum of maximum data rates of said multiple inputs is less than the maximum data rate of the at least one output.

8. Lithography system according to any one of the preceding claims, wherein the first latency is at most 200 microseconds, and wherein the second latency is at least 2000 microseconds.

9. Lithography system according to any one of the preceding claims, wherein the position measured by the measurement system comprises a position in at least two dimensions.

10. Lithography system according to any one of the preceding claims, adapted for using User Datagram Protocol over the unidirectional connection.

11. Lithography system according to any one of the preceding claims, wherein the storage system is adapted for storing the measured positions during at least an entire duration of time needed for processing a target from start to finish.

12. Lithography system according to any one of the preceding claims, wherein said positions are measured at a sampling frequency of 5 kHz or more, with each sample preferably comprising at least 512 bytes of data.

13. Lithography system according to any one of the preceding claims, wherein the receiving buffer is adapted for discarding data from the feedback control system when the receiving buffer is full.

14. Lithography system according to any one of the preceding claims, wherein the receiving buffer has a first storage capacity and the storage unit has a second storage capacity, wherein the second storage capacity is at least three orders of magnitude larger than the first storage capacity, preferably at least 5 orders of magnitude.

15. Lithography system according to any one of the preceding claims, wherein the feedback control system is further adapted for transmitting to the storage system via the unidirectional connection, one or more of control data, a timestamp, a sequence number, data representative of the internal state of the control unit, and control unit timing settings.

16. Lithography system according to any one of the preceding claims wherein the storage system is adapted for receiving said data out of order.

17. Lithography system according to any one of the preceding claims, comprising an optical column for writing a pattern on a target using one or more exposure beams, wherein said optical column comprises a focusing array for focusing said one or more exposure beams onto the target.

18. Lithography system according to any one of the preceding claims, wherein said measurement system comprises an interferometer.

19. Lithography system according to any one of the preceding claims, adapted for writing said pattern while said target is being moved within said lithography system.

20. Lithography system according to any one of the preceding claims, wherein said one or more exposure beams comprise a multitude of charged particle beamlets.

21. Lithography system according to any one of the preceding claims, wherein reading data from the storage system does not influence operation of the feedback control system, when data is being transmitted from the receive buffer of the storage system to the storage unit.

22. Method for storing positional data of a target moveable within a lithography system, said method comprising the steps of:
- substantially continuously measuring the position of the target within the lithography system,
- substantially continuously controlling displacement of the target to correct for a deviation between the measured position and a desired position of the target, wherein a first latency is defined as a maximum latency between said measuring and said controlling the actuator based on said measuring,
- storing said measured position in a storage system, wherein a second latency is defined as an average latency between receiving measured positions in the receive buffer and storing said measured positions in the storage unit,
- wherein the first latency is at least an order of magnitude smaller than the second latency,
- the feedback control system comprising a unidirectional connection for transmitting said measured positions to the storage system.

23. Method according to claim 22, wherein said controlling is performed independent of said storing.

24. Method according to claim 22 or claim 23, wherein measured positions are stored for at least an entire duration of time needed for processing a target from start to finish.

25. Method according to any one of the claims 22-24, wherein the feedback control system is adapted for substantially continuous operation independent of the storage system.

26. Method according to any one of the claims 22-25, wherein no data or signals are sent from the storage system to the feedback control system.

27. Method according to any one of the claims 22-26, wherein the storage system is external from said feedback control system.

* * * * *